United States Patent [19]

Sakaki

[11] Patent Number: 4,688,061
[45] Date of Patent: Aug. 18, 1987

[54] MOBILITY-MODULATION FIELD-EFFECT TRANSISTOR

[76] Inventor: Hiroyuki Sakaki, 174-260, Ohba-cho, Midori-ku, Yokohama-shi, Kanagawa-ken, Japan

[21] Appl. No.: 484,600

[22] Filed: Apr. 13, 1983

[30] Foreign Application Priority Data

Apr. 14, 1982 [JP] Japan ................. 57-62175

[51] Int. Cl.$^4$ .............. H01L 29/80; H01L 29/20; H01L 29/205
[52] U.S. Cl. ........................ 357/22; 357/16; 357/61
[58] Field of Search ............ 357/22, 16, 61, 23.12

[56] References Cited

U.S. PATENT DOCUMENTS

| | | | |
|---|---|---|---|
| 4,236,167 | 11/1980 | Woods | 357/23.12 |
| 4,242,691 | 12/1980 | Kotani et al. | 357/23.12 |
| 4,424,525 | 1/1984 | Mimura | 357/23 NS |
| 4,450,462 | 5/1984 | Nuyen | 357/61 |
| 4,455,564 | 6/1984 | Delagebeaudeuf et al. | 357/22 |
| 4,471,366 | 9/1984 | Delagebeaudeuf et al. | 357/16 |

Primary Examiner—Andrew J. James
Assistant Examiner—Jerome Jackson, Jr.
Attorney, Agent, or Firm—Cushman, Darby & Cushman

[57] ABSTRACT

A mobility-modulation FET utilizes a mobility-modulation system in which the mobility $\mu$ of the carriers within the channel is modulated by a signal voltage applied to gate electrodes. More particularly, in order to eliminate the limit in the response speed dependent upon the channel transit time of the carriers, a mobility-modulation system in which the channels are so formed as to vary the carrier mobility in response to the applied gate voltage is utilized, which is different from the carrier density modulation system, to thereby increase the response speed considerably.

5 Claims, 4 Drawing Figures $\begin{pmatrix} V_{g_2} = 0 \\ V_{g_7} = 0 \end{pmatrix}$ $\begin{pmatrix} V_{g_2} : - \\ V_{g_7} : + \end{pmatrix}$ $\begin{pmatrix} V_{g_2} : + \\ V_{g_7} : - \end{pmatrix}$

MOBILITY-MODULATION FIELD-EFFECT TRANSISTOR

BACKGROUND OF THE INVENTION

The present invention relates to a field-effect transistor (FET) in which electric conductivity of a semiconductor is controlled by a voltage applied from outside and, more particularly, to a mobility-modulation field-effect transistor in which mobility of carriers in channels is modulated by the external voltage i.e., the relative density of carriers in the channels is changed by the external voltage.

In general, field-effect transistors (hereinafter called FETS) are widely used as one of the most important devices in both discrete and integrated circuits because of their excellence in switching and amplifying functions and simplicity in construction. The operating principle of this FET is to modulate the density of carriers travelling within passages or channels provided in the semiconductor to conduct electricity by the action of a signal voltage applied to gate electrodes to thereby control the electric conductivity between the source and the drain electrodes. Generally, the channel transit time of carriers, that is the time $\tau_t$ required for the carriers to travel between the source and the drain electrodes, is equal to the channel length L divided by the carrier velocity v, that is the value L/v. Since the carriers within the channels are supplied from the source electrodes and the drain electrodes on opposite ends of the channels, it is required for full accomplishment of modulation of the carriers that the minimum change time of the signal voltage applied to the gate electrodes is of a substantially equal order to the channel transit time of the carriers. In order to reduce the response time of the FET, accordingly, it is essentlal to increase the carrier velocity v while reducing the channel length L. However, even in a gallium arsenide Schottky field-effect transistor GaAsMESFET known as a high-speed device, the ultimate limit of the channel transit time $\tau_t$ of the carriers is of the order of 1 picosecond ($10^{-12}$ second) because the maximum carrier velocity is of the order of $2 \times 10^7$ cm/s and the minimum channel length is of the order of 0.2 $\mu$m. That is, in FETs, as long as carrier density modulation is utilized, it is impossible in principle to make the response speed 1 picosecond or lower.

Accordingly, conventional FETs have the disadvantage that the carrier density modulation within the channel is not performed sufficiently for an electric signal changing rapidly in a time period shorter than the minimum time period required to increase or decrease the carrier density within the channel, whereby the conductivity becomes unchangeable.

SUMMARY OF THE INVENTION

An object of the present invention is to provide a mobility-modulation FET utilizing a mobility-modulation system in which the flowability or mobility u of the carriers within the channel is modulated by a signal voltage applied to gate electrodes. More particularly, in the mobility-modulation FET according to the present invention, in order to eliminate the limit in the response speed dependent upon the channel transit time of the carriers described above, a mobility modulation system in which the multiple channels are formed so as to vary the carrier mobility in the channels, i.e., so as to vary the relative density of carriers in the channels in response to the applied gate voltage. This is different from the above-described carrier density modulation system, and is advantageous to thereby increase the response speed considerably.

The present invention will be more fully understood from the detailed description given hereinbelow and the accompanying illustrations which are intended to describe but not limit the scope of the present invention.

DETAILED DESCRIPTION OF THE PREFERRED EMBODIMENTS

Figure 1:
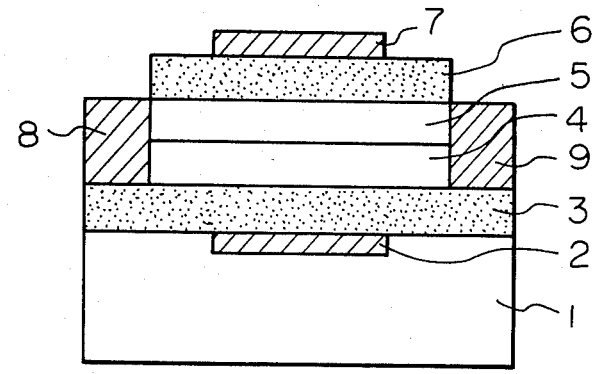
FIG. 1 is a sectional view of an embodiment of a mobility-modulation field effect transistor according to the present invention.

FIG. 1 is a sectional view of an embodiment of the mobility-modulation FET according to the present invention. In the following, while an example of the mobility-modulation FET having a dual-channel structure comprising gallium arsenide (hereinafter called GaAs) and gallium aluminum arsenide (hereinafter called GaAlAs), respectively, having different mobilities is described, it will be needless to say that a mobility-modulation FET of a multichannel structure having different carrier mobilities can be realized. In this dual-channel mobility-modulation FET, first of all, an N+GaAs layer 2 with resistivity 0.01 $\Omega$. cm and thickness 1 $\mu$m is formed as a lower gate electrode on a semiinsulating GaAs substrate 1 with specific resistance $10^6$ $\Omega$. cm by molecular beam epitaxy (MBE) method, on which a multilayer structure consisting sequentially of a GaAlAs layer 3 which is an insulating layer of thickness 0.06 $\mu$m having silicon Si of $5 \times 10^{17}$ cm$^{-3}$ doped as an impurity, a GaAs layer 4 of thickness 0.02 $\mu$m having silicon Si of $3 \times 10^{16}$ cm$^{-3}$ and beryllium Be of $3.1 \times 10^{16}$ cm$^{-3}$ doped as impurities, a high-purity P-type GaAs layer 5 of acceptor density $5 \times 10^{14}$ cm$^{-3}$ or lower and thickness 0.02 $\mu$m, a GaAlAs layer 6 which is an insulating layer of thickness 0.06 $\mu$m having silicon Si of $5 \times 10^{17}$ cm$^{-3}$ doped as an impurity, and an aluminum metal thin film 7 of thickness 0.2 $\mu$m as an upper gate electrode, is formed by MBE method, and then a source electrode 8 and a drain electrode 9 are successively formed using common photolithography. Each of the numerical values showing the impurity concentrations should be understood not only to indicate strictly the value but also to include values approximate thereto in the extent known to any person skilled in the art.

Figure 2:
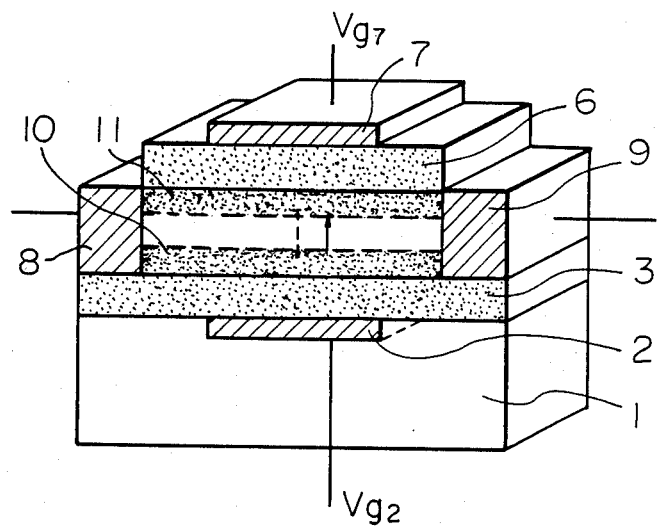
FIG. 2 is a schematic illustration of operation of the mobility-modulation field effect transistor according to the present invention.

FIG. 2 is a perspective view showing function of the mobility-modulation FET according to the present invention. A low mobility n-type conduction channel 10 containing many impurities is formed along the interface between the GaAlAs layer 3 and the GaAs layer 4, and a high-mobility upper conduction channel 11 containing fewer impurities is formed along the interface between the GaAlAs layer 6 and the GaAs layer 5.

Within the upper conduction channel 11, the carrier mobility reaches $10^5$ cm$^2$/V.S at liquid nitrogen temperature 77°K. and, on the other hand, the mobility within the lower conduction channel 10 is as low as approximately $5 \times 10^3$ cm$^2$/V S. It will be easily understood that the conductivity between the source electrode 8 and the drain electrode is determined by the sum of the conductivities of said two channels.

Now, the operation of this embodiment will be described with reference to the case where signal voltages $V_{g2}$ and $V_{g7}$ are applied to the gate electrodes 2 and 7, respectively.

Figure 3:
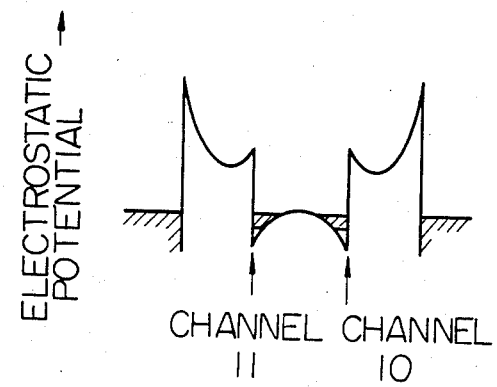
FIGS. 3a-3c are graphs showing the potential distributions in two channels under respective bias conditions.
Figure 3:
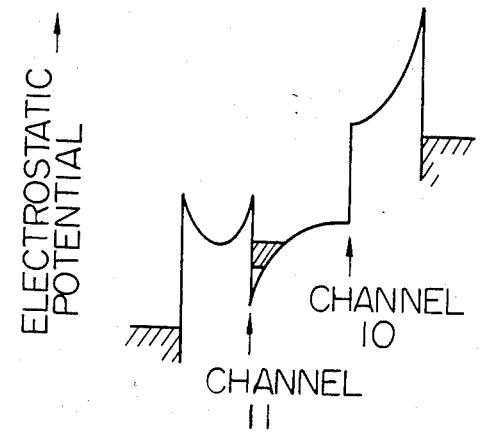
Figure 3:
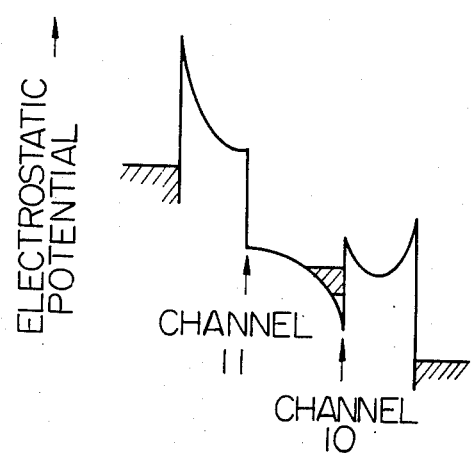

FIGS. 3(a) to 3(b) are graphs showing distributions of electrostatic potentials and electrons within the two channels under respective bias conditions. As shown in FIG. 3(a), in the case where the voltage $V_{g2}$ applied to the lower gate electrode 2 and the voltage $V_{g7}$ applied to the upper gate electrode 7 are both zero, the carrier densities within the lower channel 10 and the upper channel 11, respectively, are substantially equal ($\sim 4 \times 10^{11}$/cm$^2$). Then, in the case where a positive voltage is applied to the upper gate electrode 7 while a negative voltage is applied to the lower gate electrode 2, potentials are distributed as shown in FIG. 3(b), that is, the carriers within the lower channel 10 of low mobility move into the upper channel 11 of high mobility, as shown by a solid line. As a result, the carriers moving within the channel of low mobility pass into a high mobility state so that the average mobility of the carriers increases. Then, in the case where the polarities of the voltages applied to the gate electrodes are reversed, that is, a negative voltage is applied to the upper gate electrode 7 while a positive voltage is applied to the lower gate electrode 2, the potentials are distributed as shown in FIG. 3(c), that is the carriers move from the high-mobility upper channel 11 into the low-mobility lower channel 10. Accordingly, the average carrier mobility decreases.

In brief, in the FET of the construction shown in FIG. 1, the average mobility of the carriers can be changed without changing the carrier density by controlling polarities of the voltages applied to the gate electrodes 2 and 7. Since the conductance of the channels of the FET is proportional to the product of the carrier density and velocity, that is the value of the carrier density × mobility, the conduction changes in response to the change of the mobility described above. Accordingly, the output current between the source-drain terminals changes in response to the voltages applied to the gate electrodes 2 and 7, and the construction shown in FIG. 1 functions as the FET based on a new operational principle.

Figure 4:
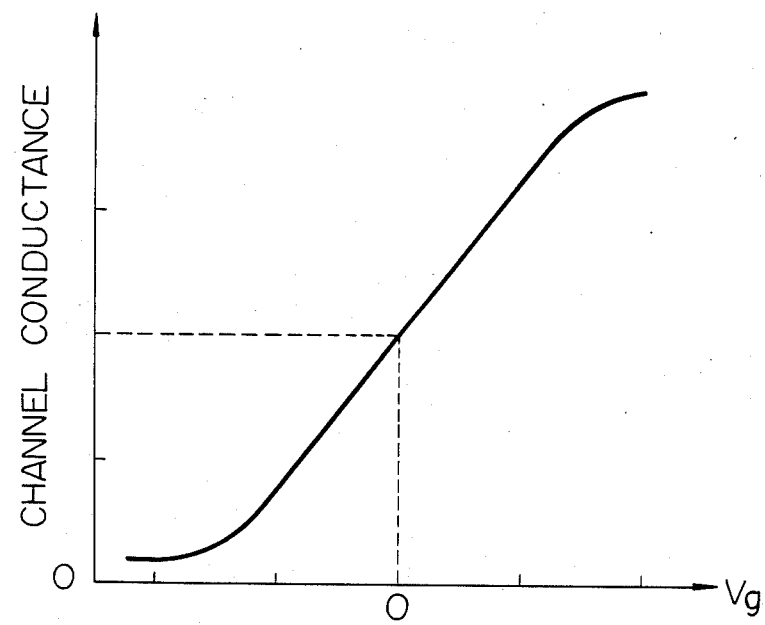
FIG. 4 is a graph showing the conductance-gate voltage characteristics of the modulation-mobility field effect transistor according to the present invention.

FIG. 4 is a graph showing the conductivity-gate voltage characteristic of the mobility-modulation FET according to the present invention. It is understood from FIG. 4 that the channel conductance is substantially linearly dependent on the gate voltage, showing a very excellent characteristic. The FET according to the present invention operates as an FET if only the carriers are movable between the upper channel and the lower channel without the necessity of changing the carrier density. Since the average distance between the two channels in this embodiment is of the order of 0.03 μm, the time period required for a carrier to traverse the distance between the channels can be reduced to a fraction of 1 picosecond which is the minimum of the channel transit time. Accordingly, in the FET according to the present invention, the minimum response time can be reduced to a fraction of that of the conventional FET.

With reference to this embodiment, the FET device of the system in which electrons move between spatially separated channels having varying carrier modilities was described hereinabove and a method of changing the impurity contents to make the channel mobilities different from each other was explained. Other methods for changing the mobilities in the upper and lower channels are to form channels utilizing different kinds of semiconductor materials having different mobilities from each other and to introduce impurity atoms having a function to capture carriers into the lower channel only so as to prevent the conductance in said channel by the carrier capturing function. Particularly, the latter method has an advantage that the carrier mobility in the channel into which the capturing impurity was introduced can be reduced to almost zero.

Besides by utilizing the spatial movement of the electrons between the upper and the lower channels as in the abovedescribed embodiment, the carrier mobilities can be changed by changing the effective masses of the carriers or the wave state within the channels. Two examples of such method will be described briefly. In substances such as gallium antimonide GaSb in which a plurality of kinds of valleys of conductive band are concerned, two kinds of electrons having different effective mass are apt to coexist. When thin channels are formed of such substance and a gate voltage is applied thereto, electrons transit between the valley of larger mass and the valley of smaller mass. At this time, the effective masses of the electrons change, to thereby change the mobility (easiness to move).

Likewise, in the case where electrons are captured in thin semiconducting channel and a standing wave state is generated, the form of the standing wave can be controlled by strengthening and weakening the capturing by the action of the gate voltages. When the electron state is changed in this way, the interaction between the electrons and the scatterers also is changed, to thereby change the mobility. Accordingly, this mechanism also can be utilized to realize the mobility-modulation FET.

The invention being best described, it will be obvious that the same may be varied in many ways. Such variations are not to be regarded as a departure from the spirit and scope of the invention and all such modifications as would be obvious to one skilled in the art are intended to be included in the scope of the following claims.

What is claimed is:

1. A mobility-modulation field-effect transistor comprising:
   a plurality of channels having a multilayer structure and being formed from a plurality of semiconductor materials, said plurality of channels having different carrier mobilities and comprising at least first and second channels, said first channel having less impurities than said second channel and accordingly said first channel having a higher carrier mobility than said second channel; and
   gate electrode means arranged for receiving an applied voltage and for varying relative densities for the carriers within said plurality of channels in accordance with said applied voltage.

2. A mobility-modulation field-effect transistor as set forth in claim 1, wherein said plurality of semiconductor materials have different impurity contents.

3. A mobility-modulation field-effect transistor as set forth in claim 1, characterized in that an impurity capable of capturing and localizing carriers is introduced into one of said plurality of channels to make the carrier mobility of said one channel nearly zero.

4. A mobility-modulation field-effect transistor as set forth in claim 1, characterized in that one channel of said plurality of channels comprises semiconductor material having a plurality of valleys of conductor bands which are different in carrier mobility from one another, and the relative carrier density is controlled by causing electron transition between the valleys by said applied voltage to said gate electrode means.

5. A mobility-modulation field-effect transistor as set forth in claim 1, characterized in that carriers are captured, in the direction perpendicular to said plurality of channels, into a standing wave, and the relative carrier density is controlled by changing the form of the standing wave by said applied voltage to said gate electrode means.

* * * * *